United States Patent [19]
Hirai et al.

[11] Patent Number: 5,492,762
[45] Date of Patent: Feb. 20, 1996

[54] CONDUCTIVE SUBSTRATE AND DISPLAY DEVICE PROVIDED WITH TRANSPARENT CONDUCTIVE SUBSTRATE

[75] Inventors: Toshiharu Hirai; Michio Komatsu; Akira Nakashima; Yoneji Abe; Yukihiro Iwasaki, all of Kitakyushu, Japan

[73] Assignee: Catalysts & Chemicals Industries Co., Ltd., Tokyo, Japan

[21] Appl. No.: 315,223

[22] Filed: Sep. 29, 1994

Related U.S. Application Data

[62] Division of Ser. No. 910,300, Jul. 20, 1992, Pat. No. 5,376,308.

[30] Foreign Application Priority Data

Nov. 21, 1990 [JP] Japan ..................... 2-316575
Apr. 22, 1991 [JP] Japan ..................... 3-90650

[51] Int. Cl.⁶ ..................... B32B 9/04; B32B 17/00; H01B 1/20
[52] U.S. Cl. ..................... 428/447; 428/448; 428/689; 428/429; 252/500; 252/518
[58] Field of Search ..................... 428/447, 689, 428/448; 252/500, 511; 524/780

[56] References Cited

U.S. PATENT DOCUMENTS

| | | | |
|---|---|---|---|
| 5,013,607 | 5/1991 | Sato et al. | 428/426 |
| 5,140,450 | 8/1992 | Nikaido | 428/447 |
| 5,229,037 | 7/1993 | Nakano et al. | 252/512 |
| 5,367,019 | 11/1994 | Sawaragi | 524/780 |
| 5,376,308 | 12/1994 | Hirai et al. | 252/518 |

FOREIGN PATENT DOCUMENTS

| | | |
|---|---|---|
| 0035609 | 9/1981 | European Pat. Off. . |
| 0232033 | 8/1987 | European Pat. Off. . |
| 58-40375 | 3/1983 | Japan . |
| 60-181177 | 9/1985 | Japan . |
| 61-245449 | 10/1986 | Japan . |
| 62-4761 | 1/1987 | Japan . |
| 62-230617 | 9/1987 | Japan . |
| 63-11519 | 1/1988 | Japan . |
| 63-46274 | 2/1988 | Japan . |
| 63-66267 | 3/1988 | Japan . |
| 63-251466 | 10/1988 | Japan . |
| 63-193971 | 11/1988 | Japan . |
| 6454613 | 2/1989 | Japan . |
| 2-22340 | 1/1990 | Japan . |
| 2-221124 | 9/1990 | Japan . |
| 2-269381 | 11/1990 | Japan . |
| 8903114 | 6/1989 | WIPO . |
| 9002157 | 8/1990 | WIPO . |

OTHER PUBLICATIONS

Chemical Abstract No. 117205p, *Chemical Abstracts*, vol. 113, No. 14, Oct. 1, 1990, Shioda et al., p. 103.
Abstract No. 90-128533/17, *Documentation Abstracts Journal*, Derwent Publications Ltd., Database WPIL, Week 9017, Jun. 20, 1990.

*Primary Examiner*—Tae H. Yoon
*Attorney, Agent, or Firm*—Webb Ziesenheim Bruening Logsdon Orkin & Hanson

[57] ABSTRACT

Conductive substrate having on their surface a coating formed from a coating solution for forming a transparent conductive coating prepared by dispersion of dissolving in water and/or organic solvent such conductive particles as having (a) an average particle diameter of not more than 500 Å, wherein (b) an amount of particles having a particle diameter of not more than 600 Å is more than 60% by weight, (c) an amount of particles having a particle diameter of not more than 100 Å is more than 5% by weight and (d) an amount of particles having a particle diameter of more than 1000 Å is not more than 15% by weight, and a matrix comprising a silica polymer having (A) an average degree of polymerization of 1,500–10,000, and (B) an amount of the polymer having a degree of polymerization of not more than 3,000 being not more than 50% by weight, and (C) an amount of the polymer having a degree of polymerization of more than 10,000 being not more than 20% by weight, are excellent in adhesion and surface smoothness and also excellent in durability and transparency. Display devices provided with the above-mentioned transparent conductive substrates as the display panel are excellent in resolving power, and give constantly clear and sharp images.

14 Claims, 1 Drawing Sheet

CONDUCTIVE SUBSTRATE AND DISPLAY DEVICE PROVIDED WITH TRANSPARENT CONDUCTIVE SUBSTRATE

This is a application Ser. No. 07/910,300 filed on Jul. 20, 1992, now U.S. Pat. No. 5,376,308.

FIELD OF INDUSTRIAL APPLICATION

This invention relates to coating solution for forming transparent conductive coatings, process for preparing the same, conductive substrates, processes for preparing the same, and display devices provided with transparent conductive substrates. More particularly, the invention relates to a coating solution capable of forming transparent conductive coatings excellent in adhesion and surface smoothness as well as in durability such as water resistance and alkali resistance, a process for preparing said coating solution, conductive substrates on the surface of which a transparent conductive coating having such excellent properties as mentioned above has been formed, processes for preparing said conductive substrates, and display devices provided with transparent conductive substrates.

TECHNOLOGICAL BACKGROUND

Though glass or plastics are being used as transparent substrates, they are liable to generate static electricity on the surface thereof, because such substrates are insulators. When these susbtrates such as glass or plastics are used for a display panel such as Braun tube (CRT), fluorescent indication pipe (FIP), plasma display (PDP), or liquid crystal display (LCD), static electricity is generated on the faceplate of the display panel and dust or the like is attracted thereto, whereby the displayed images on the panel becomes difficult to be visible. Particularly, in the case of LCD, there is sometimes observed destruction of IC or miss-operation of the display device caused by such static electricity as generated above.

In an electrophotographic duplicator for ordinary paper (PPC) equipped with an automatic draft feeder (ADF), when a copy is taken successively from a plurality of drafts through ADF, a contact glass plate on which the draft is placed and the draft in the sheet form fed through ADF are rubbed with each other, whereby static electricity is generated on the contact glass plate, and by virtue of the static electricity thus generated, the draft attaches to the contact glass plate and stays thereon, plugging sometimes the ADF with the drafts.

In order to inhibit the generation of static electricity on the above-mentioned substrates used for a display panel of the display device or contact glass plate of PPC, there has heretofore been used to apply a transparent substrate having thereon a transparent conductive film to the surface of said display panel or said contact glass plate.

Known hitherto as a technique of obtaining such transparent conductive substrates as mentioned above is, for example, a method wherein a transparent conductive film consisting of a metal or inorganic oxide is formed on the surface of a transparent conductive substrate by means of a dry process such as CVD, PVD, vacuum evaporation or sputtering, or a method wherein a conductive coating is formed on the surface of a substrate by means of a wet process which comprises applying a coating solution containing a conductive material such as tin oxide and a transparent matrix-forming component on the surface of a substrate followed by drying and curing.

In the dry process such as CVD referred to above, however, there are involved such problems that the film must be formed by a batchwise method using a vacuum evaporator, and that the surface area or shape of the substrate on which the film is formed is limited to depending upon the size of the vacuum evaporator used.

In the wet process mentioned above, on the one hand, there are involved such problems that the transparent conductive coating formed by using, as a transparent matrix-forming component, a binder resin such as acrylic resin, butyral resin, melamine resin or vinyl chloride/vinyl acetate copolymer resin is poor in transparency, scratch resistance, adhesion to the substrate or durability such as alkali resistance, acid resistance, water resistance or solvent resistance.

Recently, with the view of solving such problems as mentioned above, there have been proposed various coating solutions for forming conductive coatings and transparent conductive coatings formed by using such coating solutions for forming conductive coatings.

For example, Japanese Patent L-O-P Publn. No. 193971/1988 proposes conductive coatings consisting essentially of conductive particles and a vehicle (matrix), said conductive particles having an average particle diameter of at least 10 Å and not more than 5 μm.

Japanese Patent L-O-P Publn. No. 22340/1990 proposes molded products (transparent substrates) having thereon a transparent coating (transparent conductive coating) containing 5–80% by weight of particulate inorganic substance consisting of tin oxide having an average particle diameter of 1–300 μm.

In the proposals mentioned above, there are used, as the matrices, organosilicon compounds represented by the following general formula (A).

$$R^1_a R^2_b Si(OR^3)_{4-a-b} \quad (A)$$

By way of Japanese Patent L-O-P Publn. No. 54613/1989, WO89/03114 and WO90/02157, the present applicant has proposed coating solutions for forming conductive coatings prepared by mixing conductive substances with partial hydrolyzates of alkoxysilane and acetylacetonatochelate such as bisacetylacetonatodialkoxy zirconium as a matrix in a mixed solvent of water-organic solvent, and substrate having on the surface thereof a transparent conductive coating obtained from the above mentioned coating solutions.

These substrates having coated thereon a transparent conductive coating as obtained above, however, are required to have further improved durability and also excellent surface smoothness, though said substrates are excellent in conductivity and transparency and also found to be at least satisfactory with respect to properties such as durability.

In the case of a display panel with a transparent conductive coating, it is requested that the quality, especially resolving power, of the images displayed by means of a display device equipped with the display panel will not be deteriorated by the presence of said transparent conductive coating.

The present invention has been made in view of such circumstances as mentioned above, and the main objects of the invention are to provide coating solutions capable of forming transparent conductive coatings excellent in adhesion, surface smoothness and durability such as alkali resistance and water resistance on the surface of substrates such as glass, plastics and the like, process for preparing the same, conductive substrates having formed on the surface thereof transparent conductive coating having such excellent properties as mentioned above, processes for preparing the same, and display devices equipped with said transparent conductive substrates.

DISCLOSURE OF THE INVENTION

The coating solution for forming a transparent conductive coating of the present invention is characterized by comprising conductive particles having (a) an average particle diameter of not more than 500 Å, and (b) an amount of particles having a particle diameter of not more than 600 Å being more than 60% by weight, (c) an amount of particles having a particle diameter of not more than 100 Å being more than 5% by weight, and (d) an amount of particles having a particle diameter of more than 1000 Å being not more than 15% by weight, and a matrix comprising a silica polymer having (A) an average degree of polymerization of 1,500–10,000, and (B) an amount of the polymer having a degree of polymerization of not more than 3,000 being not more than 50% by weight, and (C) an amount of the polymer having a degree of polymerization of more than 10,000 being not more than 20% by weight.

The coating solution for forming a transparent conductive coating mentioned above may be prepared by dispersing or dissolving in water and/or organic solvent conductive particles having specific average particle diameter and particle size distribution mentioned above obtained by pulverizing and/or classifying powdered conductive particles or conductive particle dispersed in a sol and a matrix having the specific degree of polymerization as defined above.

The conductive substrates of the invention comprises a substrate and a transparent conductive coating formed from such coating solution for forming a transparent conductive coating as mentioned above.

The conductive substrate of the invention as mentioned above may be prepared by applying the above-mentioned coating solution for forming transparent conductive coatings onto the surface of the substrate, followed by heat curing.

The above-mentioned conductive substrate may also be prepared favorably by irradiating the transparent conductive coating as formed and still at an uncured stage prior to heating with an electromagnetic wave having a wavelength shorter than that of visible light, or by exposing the transparent conductive coatings at an uncured stage to a gaseous atmosphere wherein curing reaction of said conductive coating is accelerated.

The display device of the invention is characterized in that a display panel of said display device has a transparent conductive coating as obtained from the coating solution for forming transparent conductive coatings mentioned above on the face-plate of a display panel.

BEST MODE OF THE INVENTION

Figure 1:
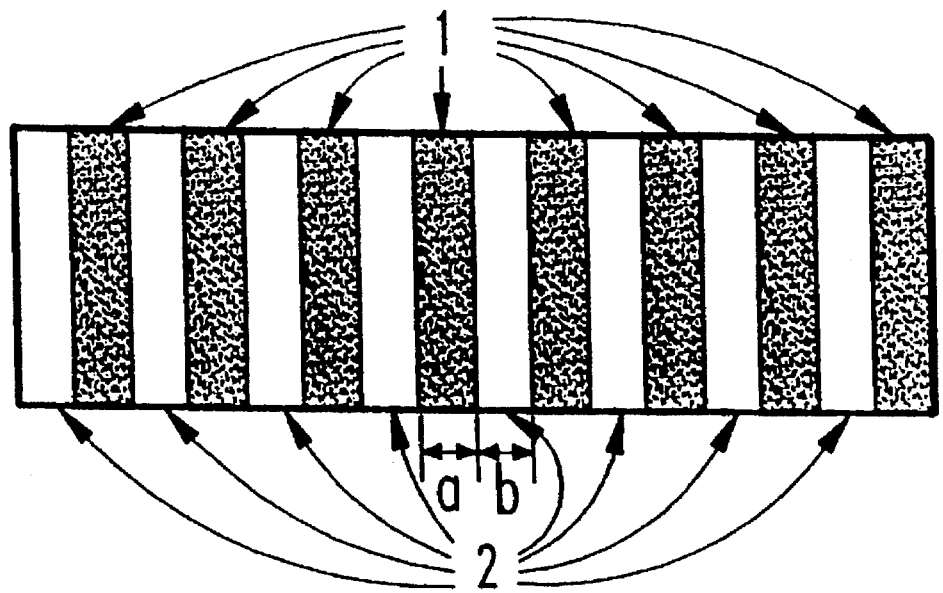
FIG. 1 is a sketch of a bar chart used in the invention for the measurement of resolving power.

To begin with, the coating solution for forming a transparent conductive coating, conductive substrate, and process for the preparation thereof of the present invention are illustrated below in detail.

I) Coating Solution for Forming a Transparent Conductive Coating

The coating solution of the invention for forming a transparent conductive coating is a dispersion which comprises a) conductive particles having a specific average particle diameter and specific particle size distribution as defined above and b) a specific matrix as mentioned above in a dispersion medium composed of water and/or organic solvent.

a) Conductive Particles

The conductive particles used in the invention include those known hitherto, concretely tin oxide, tin oxide doped with Sb, F or P, indium oxide, indium oxide doped with Sn or F, and antimony oxide.

The conductive particles as mentioned above may be obtained by the method disclosed in Japanese Patent L-O-P Publication Nos. 230617/1987, 11519/1988 or 221124/1990 filed previously by the present applicant.

The conductive particles used in the invention have an average particle diameter of not more than 500 Å, preferably 50–300 Å, and an amount of particles having a diameter of not more than 600 Å is more than 60% by weight, preferably more than 80% by weight based on all transparent conductive particles, an amount of particles having a diameter of not more than 100 Å is more than 5% by weight, preferably more than 20% by weight based on all transparent conductive particles, and an amount of particles having a diameter of more than 1000 Å is not more than 15% by weight, preferably not more than 5% by weight based on all transparent conductive particles.

The conductive particles having such specific average particle diameter and particle size distribution as defined above may be prepared by pulverizing and/or classifying such known conductive particles as mentioned above by means of a suitable means until the average particle diameter and particle size distribution of said particles satisfactorily fall within the above-mentioned ranges.

The pulverization and/or classification for controlling the average particle diameter and powder size distribution of the above-mentioned conductive particles may be carried out at a stage of either powder or sol, and may also be carried out either before or after the preparation of the coating solution for forming a transparent conductive coating.

In the present invention, because the conductive particles having specific average particle diameter and particle size distribution as defined above are used for preparing coating solutions for forming a transparent conductive coating, the resulting coating solutions are found to be stable, keeping the conductive particles highly dispersed.

b) Matrix

Silica polymers are used as matrices in the coating solution of the present invention for forming a transparent conductive coating.

The silica polymers mentioned above have an average degree of polymerization of 1,500–10,000, preferably 2,500–7,500, wherein not more than 50% by weight, preferably not more than 20% by weight of the polymer has a degree of polymerization of not more than 3,000, and not more than 20% by weight, preferably not more than 10% by weight of the polymer has a degree of polymerization of more than 10,000.

By silica polymers as referred to herein are meant polycondensation products obtained by hydrolysis of organosilicon compounds such as alkoxysilane.

The organosilicon compounds used therein include concretely one of the alkoxysilanes represented by the following general formula [I], or a combinations of two or more said alkoxysilanes.

$$R_a\text{—Si—}(OR')_{4-a} \qquad [I]$$

wherein R is an alkyl group represented by $-C_nH_{2n+1}$ (n=1–4), hydrogen atom or halogen atom, R' is the same alkyl group as defined above by R or an alkylalkoxy group represented by $-C_2H_4OC_nH_{2n+1}$ (n=1–4) or hydrogen atom, and a is an integer of 0–3.

The degree of polymerization as used in the invention signifies the degree of polymerization in terms of polystyrene as determined by means of gel chromatography.

The silica polymers used in the invention may be obtained, for example, by a method wherein the above-mentioned alkoxysilane is subjected to hydrolysis in the presence of acid, for example, nitric acid, hydrochloric acid or acetic acid in a mixed solvent such as water-alcohol.

The hydrolysis of the alkoxysilane as mentioned above is carried out preferably under the conditions where acid/ $SiO_2$=0.0001–0.05 (wt/wt) and water/$SiO_2$=4–16 (mol/mol) in which $SiO_2$ represents a value obtained by converting the alkoxysilane into $SiO_2$.

The hydrolysis of the alkoxysilane is preferably carried out at a temperature of from room temperature to 200° C.

Further, a concentration of the alkoxysilane used for the hydrolysis is preferably about 3–25% by weight in terms of $SiO_2$, and the concentration thereof is preferably controlled to be higher when the hydrolysis temperature becomes lower.

The coating solution for forming a transparent conductive coating may be prepared by dispersing or dissolving in water and/or organic solvent conductive particles having specific average particle diameter and particle size distribution mentioned above and the matrix having the specific degree of polymerization as defined above.

The preparation of the coating solution is, for example, carried out as follows:

To a sol in which the conductive particles having the specific particle size distribution dispersed in the sol, a dispersion of the silica polymers having the specific degree of polymerization dispersed in water-alcohol is added in a predetermined amount. A solid content (conductive particles and silica polymers) of the resulting mixture is controlled by adding water and/or alcohol.

Then an acid such as hydrochloric acid and nitric acid is added to the mixture to control a pH of the mixture to 1.5–6.0, preferably 1.5–4.0, to obtain the coating solution.

The mixing ratio of the conductive particles to the matrix in the coating solution for forming a transparent conductive coating is preferably as follows:

$$EO_x/SiO_2=0.5-5.0 \text{ (wt/wt)}$$

wherein $EO_x$ represents a weight of the conductive particles in terms of oxides, and $SiO_2$ represents a weight of the silica polymers in terms of oxides.

If the coating solution for forming a transparent conductive coating applied to the surface of the substrate contains excessively large amount of the matrix component, the resulting coating decreases in conductivity and, on the contrary, if the amount of the conductive particles contained in said coating solution is excessively large, dispersibility in the coating solution of the conductive particles or preservability of the coating solution deteriorates, or the coating formed therefrom deteriorates sometimes in transparency or in adhesion to the substrate.

In the coating solution for forming a transparent conductive coating, the sum total of solids content of the conductive particles and matrix is desirably not more than 15% by weight.

The organic solvents used as dispersion media for the above-mentioned conductive particles and matrix include, though not particularly limited, for example, alcohols such as methanol, ethanol, propanol, butanol, diacetone alcohol, furfuryl alcohol, ethylene glycol and hexylene glycol; esters such as methyl acetate and ethyl acetate; ethers such as diethyl ether, ethylene glycol monomethyl ether, ethylene glycol monoethyl ether, ethylene glycol monobutyl ether, diethylene glycol monomethyl ether and diethylene glycol monoethyl ether; and ketones such as acetone, methyl ethyl ketone, acetylacetone and acetoacetic ester.

Such coating solution of the invention for forming a transparent conductive coating as obtained in the manner mentioned above may also be incorporated with various other components for the purpose of imparting additionally another function to the coating solution.

For example, a display panel having a transparent conductive coating prepared by using the coating solution incorporated with small amounts of a dye, particularly a face plaze of CRT, will absorb light of specific wavelengths to improve contrast.

Furthermore, a refractive index of the coating can be adjusted by allowing a metallic oxide such as $ZrO_2$, $TiO_2$ or $CeO_2$, or a compound oxide thereof to coexist in said coating. In this case, the particulate metallic oxide or its precursor is added to the coating solution.

The precursor useful in that case includes acetylacetonate chelate compounds such as dibutoxybisacetylacetonate zirconium and dibutoxybisacetylacetonate titanium, or metallic alkoxide compounds such as tetrabutoxy zirconium and tetraisopropoxy titanium.

Further, it is also possible to add as an auxiliary binder a silicic acid solution obtained by dealkalization of an alkali metal silicate.

II) Conductive Substrate

The conductive substrate of the present invention comprises a substrate such as glass or plastics and a transparent conductive coating formed on the surface of said substrate by coating said surface with the above-mentioned coating solution for forming a transparent conductive coating.

In this connection, the substrate having the above-mentioned transparent conductive coating formed on their surface have a surface resistivity of $10^3$–$10^{10}$ $\Omega/\square$. Of the conductive substrate mentioned above, those which are not subjected to non-glare treatment have a haze of not more than 1%, and those which are subjected to non-glare treatment have a glossiness of 40–90%.

The conductive substrates of the invention may have a transparent protective coating formed on the surface of the transparent conductive coating.

The transparent conductive coating formed on the surface of the conductive substrate of the invention contains a minor proportion of conductive particles having a large particle diameter. That is, this transparent conductive coating is formed by using a coating solution wherein the amount of particles having a particle diameter of not more than 600 Å is more than 60% by weight and the amount of particles having a particle diameter of more than 1000 Å is not more than 15% by weight. On that account, the surface of this transparent conductive coating is excellent in smoothness even when said coating is made thin, and almost free from uneveness due to the presence of large particles in said coating. In the conductive substrates of the invention, therefore, the formation of scattered light on the surface of the transparent conductive coating can be decreased and, at the same time, the formation of scattered light caused by the particles in this coating can be inhibited.

As mentioned above, in the present invention the particle diameter range of the conductive particles contained in the coating solution for forming a transparent conductive coating is specifically defined above and, in addition thereto, the content of particles having a particle diameter of not more than 100 Å is defined to be more than 5% by weight, hence the proportion of large particles contained in the coating solution is far smaller in comparison with the coating solutions which are not so defined. Accordingly, in the coating formed on the substrate by using the coating solution of the invention as mentioned above, practically no large particle is present. On that account, the formation of scattered light caused by the particles having a large particle diameter present in the transparent conductive coating as formed is further decreased, and the conductive substrates of the invention having formed the transparent conductive coating on their surface thus obtained are found to be excellent in transparency and low in haze.

In particular, there is obtained a display panel for a display device having excellent resolving power by forming the above-mentioned transparent conductive coating on said panel.

In the transparent conductive coating formed on the conductive substrate of the invention, the conductive particles are uniformly dispersed, because the coating solution used contains a minor proportion of large particles and particles having particle diameters falling within the specific range as defined above.

Accordingly, when the transparent conductive coating having the same surface resistivity as in coatings obtained from conventional coating solutions containing a major proportion of conductive particles having large particle diameter is desired to obtain, said conductive coating can be reduced in thickness.

Because the silica polymers having a specific distribution in degree of polymerization as mentioned above are used as matrices in the coating solution of the invention for forming a transparent conductive coating, the coating solution as applied to the substrate will cure to form a compact coating practically free from voids (pores or minute cracks). Accordingly, the coating formed by means of the coating solution of the invention comprising a combination of the matrix and fine conductive particles having such characteristic features is extremely even and smooth on its surface.

The term smoothness as used in the invention means that the coating is free from unevenness and small in surface roughness and, in addition thereto, said coating has a denseness free from the above-mentioned void.

The conductive substrates of the invention are excellent in optical characteristics such as transparency and low haze, and of course excellent in surface hardness. Also, they are excellent in durability against an acid or alkali atmosphere or the circumstances of high temperature and humidity and, at the same time, excellent in stain resistance. The term stain resistance as used in the invention is intended to designate such properties of the coating that the coating is difficult to stain and, even when said coating stains, the substance that has stained said coating can readily be removed therefrom.

The transparent conductive coating formed on the surface of the substrate of the invention has a thickness desirably of about 500–7000 Å.

The conductive substrates of the invention may have a transparent projective coating further formed on the transparent conductive coating formed already on said substrate.

The conductive substrates having a surface resistivity falling within the range of $10^3$ $\Omega/\square$ to $10^{10}$ $\Omega/\square$, and a haze of not more than 1% can be obtained by forming the transparent conductive coating having the above-mentioned coating thickness on the surface of said substrate and, if necessary, by forming further the transparent protective coating on said transparent conductive coating. Further, when the non-glare treatment as will be mentioned later is carried out at the time of forming the coating on the substrate having the same surface resistivity as obtained in the case where no non-glare treatment is carried out, and a glossiness of 40–90%.

Furtheremore, by controlling optical characteristics of the above-mentioned transparent conductive coating and transparent protective coating in the manner as will be mentioned later, there can be obtained a conductive substrate having a surface resistivity of $10^3$–$10^{10}$ $\Omega/\square$, a glossiness of 40–90% and a surface reflectance of not more than 1%.

III) Process for Preparing Conductive Substrate

The conductive substrates of the present invention may be prepared by coating the surface of the substrate such as glass or plastics with the coating solution for forming a transparent conductive coating by means of a method such as dipping, spinner, spraying, roll coater or flexo printing, followed by drying at ordinary temperature to 90° C. and then curing by application of heat of more than 100° C.

Further, the conductive substrates which exhibit the above-mentioned effects thereof more prominently can be obtained by the following procedure.

That is, after the above-mentioned coating or drying process or during the drying process, the transparent conductive coating coated and still at an uncured stage is irradiated with an electromagnetic wave having a wavelength shorter than that of visible light, or the transparent conductive coating at an uncured stage is exposed to a gas atmosphere wherein curing reaction of the conductive coating as coated is promoted.

The electromagnetic wave with which the uncured transparent conductive coating is irradiated before heating includes concretely ultraviolet rays, electron rays, X-rays and gamma rays, and of these rays, preferred are ultraviolet rays. The uncured transparent conductive coating as coated is irradiated with ultraviolet rays having an energy amount of more than 100 mJ/cm$^2$, preferably more than 1000 mJ/cm$^2$ by using as a source of ultraviolet rays, for example, a mercury lamp wherein an intensity of emission becomes maximal at about 250 nm and 360 nm, and an intensity of light is more than 10 mW/cm$^2$, preferably 100 mW/cm$^2$.

The gas which promotes the curing reaction of the transparent conductive coating at an uncured stage before heating includes, for example, ammonia or ozone. The promotion of curing of the transparent conductive coating as formed may be accomplished, for example, by treating said coating at an uncured stage for 1–60 minutes with such active gas as mentioned above in an active gas atmosphere having a gas concentration of 100–10,000 ppm, preferably 1,000–10,000 ppm.

By carrying out the above-mentioned cure promotion treatment, polymerization of the matrix is promoted and, at the same time, evaporation of water and solvent remaining in the coating is also promoted. As the result, heat-curing conditions such as a heating temperature and heating time to be employed in the subsequent heating process can be moderated.

In the invention, when the surface of the substrate such as glass or plastics is coated by the spray method with the coating solution, while preheating said surface to about 40°–90° C. and maintaining said temperature, and the thus coated substrate is subjected to heat-curing treatment, a number of minute ring-like irregularities are formed on the surface of the coating, whereby a non-glare transparent conductive substrate with little glare is obtained. Accordingly, when the transparent conductive substrate is prepared by such procedure as mentioned above, performance of the substrate such as stain resistance and durability will not deteriorate, though an apparent surface roughness of the surface of the coated film is lost more or less.

Furthermore, prior to this heat-curing treatment, the above-mentioned cure promotion treatment may also be carried out.

As mentioned previously, the transparent protective coating may be formed on the transparent conductive coating formed on the substrate by means of the above-mentioned procedure.

The transparent protective coating mentioned above desirably has a thickness of not more than about 0.5 μm, and this transparent protective coating may be formed by the same method as used in forming the transparent conductive coating on the substrate, including the steps of coating, drying and heating in succession. In that case, the above-mentioned cure promotion treatment and/or non-glare treatment may be carried out at the time of forming the transparent protective coating.

The coating solutions for forming a transparent protective coating preferably used in the above case include the above-mentioned coating solutions for forming a transparent conductive coating from which the conductive particles have been omitted, or the coating solutions containing the conductive particles in amounts smaller than that of the conductive particles contained in the above-mentioned coating solution for a transparent conductive coating.

In preparing the conductive substrate by laminating the conductive coating and the transparent protective coating successively on the substrate, coating solutions incorporated with refractive index adjusting compound particles, that is, compound particles capable of adjusting refractive index of each coating, are used in amounts controlled so that a coating having desired refractive index and film thickness is formed from each coating solution on the substrate, whereby the conductive substrate having a reflection preventive ability wherein the reflectance of external light is not more than 1%.

In that case, the compound particles to be added to the coating solution for forming a transparent conductive coating are metallic oxide particles such as $ZrO_2$, $TiO_2$ or $CeO_2$, compound oxide particles thereof, or particles consisting of precursor thereof.

The compound particles to be added to the coating solution for forming a transparent protective coating are particles of $MgF_2$ or $CaF_2$.

IV) Display Device Provided with Transparent Conductive Substrate

The display devices of the present invention are those which display images electrically such as Braun tube (CRT), fluorescent indicator pipe (FIP), plasma display (PDP), liquid crystal display (LCD), etc., and a transparent conductive coating is formed on the face-plate of the display panel thereof. That is, the display devices of the present invention are equipped with a display panel with a transparent conductive coating as a transparent conductive substrate.

The transparent conductive coating is formed by using the above-mentioned coating solution of the invention for forming a transparent conductive coating.

The display panel with the transparent conductive coating thus formed is excellent in conductivity, smoothness, durability, adhesion between the coating and the substrate, and stain resistance. Furthermore, resolving power of the displayed images observed through the display panel with the transparent conductive coating is maintained at a high level.

In this connection, the display panels with the transparent conducive coating have all a surface resistivity of $10^3$–$10^{10}$ $\Omega/\square$. The display panels comprising the transparent conductive substrate not subjected to non-glare treatment have a haze of not more than 1% and a resolving power of more than 70 bar/cm, and the display panel comprising the transparent conductive substrate subjected to non-glare treatment have a glossiness of 40–90% and a resolving power of more than 60 bar/cm. The term resolving power as used herein is intended to designate a value measured by the following method.

Figure 2:
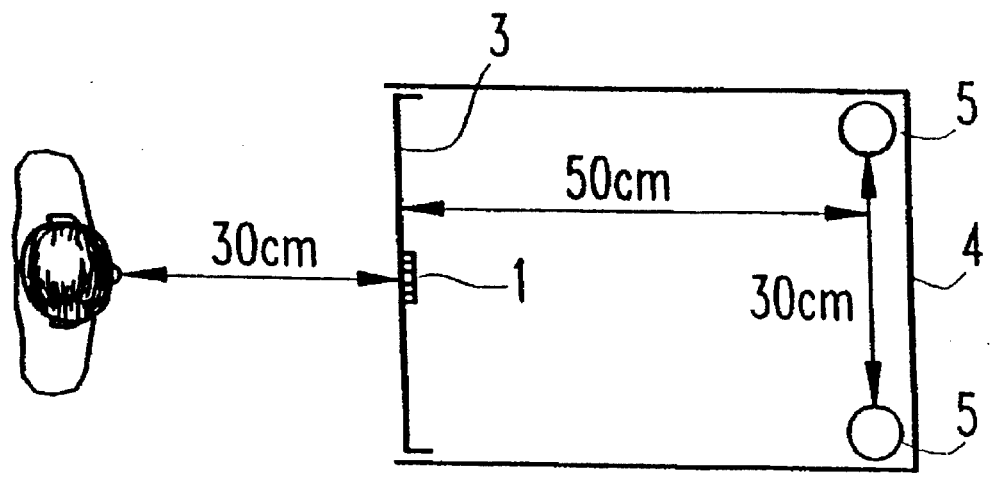
FIG. 2 is an illustration showing how to measure resolving power.

As shown in FIG. 1, a bar chart 1 having printed a given number per 1 cm of bars 2 is applied to one side of a test display panel on which no film is formed, and said panel is placed in a test device 4 shown in FIG. 2 so that the side of said panel to which the bar chart has been applied is positioned inside the test device 4. In the test device 4 having a white inner wall 2 pieces of fluorescent lamps (20 W) are placed laterally at an interval of 30 cm at a distance of 50 cm from the position of the test display panel. In this case, the bar chart used is changed successively from one having a small number of bars per 1 cm to the other having a larger number of bars per 1 cm, and the maximal number of bars per 1 cm in the bar chart that can be confirmed by visual observation is taken as a resolving power.

In the display devices of the invention, the reflectance of the display panel can be reduced to not more than 1% by forming on the face-plate of the display panel a transparent conductive coating containing the above-mentioned refractive index adjusting compound particles such as $TiO_2$ or $ZrO_2$ and further forming a protective coating containing the above-mentioned refractive index adjusting compound particles such as $MgF_2$ or $CaF_2$ on the surface of the transparent conductive coating. That is, reflection of light occurring on surface of the display picture can be prevented, whereby the picture displayed on the display panel becomes easy to see.

In the display devices of the present invention, various improvements such as prevention of reflection of light on the displayed picture can be made, for example, by forming a special protective coating on a transparent conductive coating formed on the face-plate of the display panel.

Effect of the Invention

The coating solutions of the present invention for forming a transparent conductive coating which contain conductive particles having a specific particle size distribution and a matrix comprising of a specific silica polymer are capable of forming on the surface of a substrate conductive coatings excellent in adhesivity and surface smoothness as well as in durabiling such as water resistance and alkali resistance, and also excellent in optical characteristics such as transparency, haze and glossiness.

That is, the conductive particles are fine particles having specific particle size distribution with a minor proportion of large particles, hence transparent conductive coatings which are smooth and low in haze even when the coating thickness of said coating is made thin.

The conductive particles are well dispersed in the coating solution, and therefore, the coatings sufficiently low in surface resistivity can be obtained even when the amount of the conductive particles is reduced.

Because the matrix comprises a silica polymer having a specific degree of polymerization, when the above-mentioned conductive particles are dispersed in the coating solution containing said matrix, the resulting coating solution is practically free from aggregation of the conductive particles, and in the coating formed therefrom the monodispersed state of the conductive particles is maintained. Accordingly, extremely flat and smooth transparent conductive coatings excellent in adhesion and excellent in durability and stain resistance such as moisture resistance and alkali resistance can be obtained by the use of the above-mentioned coating solutions of the invention which contribute to surface smoothness of the coatings, which are practically free from voids caused by the aggregated conductive particles present therein, and which promote denseness of the coating.

Because the display devices of the invention are equipped with display panels having formed thereon transparent conductive coatings having excellent properties as mentioned above, the display panels can maintain their antistatistic effect on the picture of displays for a long period of time even when the display devices are used under severe circumstances. On that account, the display pannels are difficult to attract dusts or the like, and a state wherein IC breakage and wrong behavior are less observed is maintained for a long period of time.

Furthermore, according to the display devices of the present invention, clear and sharp images are obtained, because the displayed images observed through the display panel are maintained at high levels of resolving power.

The present invention is illustrated below in detail with reference to examples, but it should be construed that the invention is in no way limited to those examples except to the extent set forth in the appended claims.

First, preparative examples of matrices and conductive particles used in the invention are set forth hereinafter.

[Preparation Example 1]

Preparation of Matrix

Ethyl silicate 28 ($SiO_2$ concentration 28% by weight) or ethylsilicate 40 ($SiO_2$ concentration 40% by weight) was added to a mixed solution comprising organic solvent, water and acid, and the resulting mixture was allowed to undergo hydrolysis under the conditions as shown in Table 1 to prepare matrices A–G.

TABLE 1

| | Alkoxy-silane (g) | | Organic Solvent (g) | | Pure Water (g) | Acid (g) | | Reaction Condition | | Average Degree of Polymerizatioon | Not more than 1000 (%) | Not more than 3000 (%) | Not less than 10000 (%) |
|---|---|---|---|---|---|---|---|---|---|---|---|---|---|
| | | | | | | | | Temp. (°C.) | Time (Hr) | | | | |
| A | Ethyl silicate-28 | 100 | Ethanol | 782.9 | 50.4 | 61% $HNO_3$ | 0.14 | 120 | 1 | 2800 | 5 | 50 | 5 |
| B | Ethyl silicate-40 | 100 | Ethanol | 604.0 | 96.0 | 35% HCl | 0.50 | 100 | 0.5 | 2300 | 10 | 40 | 0 |
| C | Ethyl silicate-28 | 100 | Isopropanol | 53.0 | 33.6 | 35% HCl | 0.50 | 40 | 48 | 4200 | ≦1 | 20 | 10 |
| D | Ethyl silicate-40 | 100 | Ethanol | 604.0 | 96.0 | 61% $HNO_3$ | 0.02 | 100 | 0.5 | 7500 | ≦1 | 10 | 10 |
| E | Ethyl silicate-40 | 100 | Ethanol Methanol n-butanol | 21 18 18 | 96.0 | 61% $HNO_3$ | 4.0 | 25 | 45 min | 1600 | 0 | 50 | 0 |
| F* | Ethyl silicate-40 | 100 | Ethanol | 508.0 | 192.0 | 61% $HNO_3$ | 0.01 | 100 | 0.5 | 12000 | ≦1 | 10 | 30 |
| G* | Ethyl silicate-40 | 100 | Ethanol | 648.0 | 48.0 | 61% $HNO_3$ | 0.06 | 100 | 0.5 | 900 | 70 | 90 | 0 |

*Comparative Example

According to the process for preparing conductive substrates of the invention, heat-curing conditions can be moderated by irradiating the transparent conductive coating at an uncured stage before heating with an electromagnetic wave having a wavelength shorter than that of visible light, or subjecting the transparent conductive coating to cure promotion treatment such as exposure to a specific gas atmosphere.

[Preparation Example 2]

Preparation of Conductive Particles

1) An aqueous solution was prepared by dissolving 333 g of potassium stannate and 69.5 g of tartar emetic in 1019 g of pure water. This aqueous solution was added to 1867 g of pure water kept at 50° C. over a period of 12 hours. At that time, concentrated $HNO_3$ was added simultaneously to maintain pH of the mixed solution at 8.5. From the resulting tin oxide hydrate dispersion, the tin oxide hydrate removed by ultra-filtration. The removed tin oxide hydrate was then washed and dried, followed by calcining at 550° C. for 3 hours.

400 g of the thus obtained tin oxide particles doped with antimony was added to 1600 g of an aqueous solution containing 40 g of KOH. The resulting mixture was stirred by means of a sand mill for 5 hours while keeping said mixture at 30° C., followed by dealkalization by means of a cation exchange resin. There was obtained a conductive tin oxide colloidal particle dispersion I having a particle size as shown in Table 2.

2) The procedure of the above 1) was repeated to obtain a conductive tin oxide colloidal particle dispersion II, except that the pH of the mixed solution at the time of formation of tin oxide hydrate was maintained at 10.

3) A tin oxide hydrate dispersion obtained under the same conditions as in the above 2) was subjected to ultra-filtration, washed and charged with 300 g of an aqueous solution containing 5% by weight of $H_2O_2$. The resulting mixture was heated at 100° C. for 30 minutes, and then put into an autoclave in which the mixture was further heated at 300° C. for 2 hours to obtain a conductive tin oxide colloidal particle dispersion III.

4) A conductive tin oxide colloidal particle dispersion IV was obtained by repeating the same procedure as in the above 1) except that the sand mill treatment was carried out for 3 hours, followed by centrifugal treatment (5000 ppm, 1 hour).

5) A conductive tin oxide colloidal particle dispersion V was obtained under the same conditions as in the above 1) except that the content of KOH in the aqueous KOH solution used at the time of the sand mill treatment was changed to 10 g of KOH.

TABLE 2

| Dispersion No. | Average Particle Diameter (Å) | Particle Size Distribution (%) Not more than 100 Å | Not more than 600 Å | Not less than 1000 Å | Solids Concentration (wt %) |
|---|---|---|---|---|---|
| I | 400 | 10 | 60 | 10 | 20 |
| II | 100 | 80 | 80 | 0 | 20 |
| III | 200 | 40 | 90 | 0 | 20 |
| IV | 300 | 5 | 100 | 0 | 20 |
| V (Comp.) | 900 | 2 | 10 | 30 | 20 |

(Comp.): Comparative example

[Examples 1–8, Comparative Examples 1–3]

Preparation of Coating Solution for Forming a Transparent Conductive Coating

A mixture comprising the matrix obtained in Preparation Example 1, the conductive tin oxide colloidal particle dispersion obtained in Preparation Example 2, an organic solvent and pure water as diluent was adjusted to indicated pH shown in Table 3 by the addition of acid to prepare coating solutions of Examples 1–8 and Comparative Examples 1–3 for forming a transparent conductive coating as shown in Table 3.

TABLE 3

(Coating Solution for forming a transparent conductive coating)

| | Coating solution No. | Conductive particle dispersion | | Matrix (g) | | Diluent (g) | | pH | Solids concentration (% by weight) | Other additive |
|---|---|---|---|---|---|---|---|---|---|---|
| Ex. 1 | 1 | I | 30 | A | 120 | Ethanol | 170 | 3.0 | 3.0 | |
| Ex. 2 | 2 | II | 30 | B | 67 | Water Ethanol | 33 337 | 2.5 | 2.0 | |
| Ex. 3 | 3 | III | 30 | C | 10 | Isopropanol Ethanol | 30 30 | 2.0 | 7.5 | |
| Ex. 4 | 4 | III | 30 | B | 60 | DAA Ethanol | 45 315 | 3.0 | 2.0 | Dye (Rhodamine 6G) (0.06% by weight) |
| Ex. 5 | 5 | III | 30 | B | 40 | DAA Ethanol | 45 325 | 3.0 | 2.5 | Dibutoxy-bisacetyl-acetonate. zirconium (10 g) |
| Ex. 6 | 6 | II | 30 | A | 67 | Water Ethanol | 107 107 | 3.0 | 2.5 | |
| Ex. 7 | 7 | IV | 30 | D | 60 | Ethanol | 360 | 2.0 | 2.0 | |
| Ex. 8 | 8 | II | 30 | E | 32 | n-Butanol Methanol | 149 149 | 1.5 | 1.5 | |
| Comp. Ex. 1 | 9 | III | 30 | F | 80 | Water Ethanol | 60 163 | 3.0 | 3.0 | |
| Comp. Ex. 2 | 10 | V | 30 | B | 60 | DAA Ethanol | 45 405 | 3.0 | 3.0 | |
| Comp. Ex. 3 | 11 | II | 30 | G | 60 | Ethanol | 360 | 2.0 | 2.0 | |

DAA: Diacetone alcohol

[Examples 9–16, Comparative Example 4–6]

Preparation of Display Panel with Transparent Conductive Coatings

Display panels for Braun tube (14 inches) preheated or not preheating were individually coated with coating solutions of Examples 1–8 and Comparative Examples 1–3 under the conditions as shown in Table 4 to prepare display panels with each of the transparent conductive coatings of Examples 9–16 and Comparative Examples 4–6, respectively. The coating conditions and cure promotion treatment conditions employed are as follows:

Spray condition: 1A Nozzle, a product of SPRAYING SYSTEM CO., Air Pressure 1.5 kg/cm$^2$, Solution feeding rate 20 ml/min. for 1 minute Spinner conditions: 100 rpm, 30 seconds Ultraviolet ray irradiation: Mercury lamp, 500 mW/cm$^2$ 6000 mJ Ammonia treatment: Exposed for 5 minutes in atmosphere of containing 10,000 ppm $NH_3$ vapor Haze: The measurement was conducted by means of a haze computer (a product of Suga Shiken-Ki K.K.).

Glossiness: Measured according to JIS K7105-81. (Angle of Measurement 60° C.)

Surface resistivity: Measured by means of HIRESTA or LORESTA (Products of Mitsubishi Petrochemical Co., Ltd.)

Film strength: To an office eraser (equivalent to No. 50-50 LION) placed on the coating was applied to a load of 1 kg, and the eraser was slidden 200 times reciprocatively. Thereafter, a comparison was made on glossiness before the test and after the test ($\Delta G$), and the ratio of surface resistivity before the test (Rs) and after the test (Rm).

Resistance to boiling water: The panel was immersed in boiling water for 30 minutes and for 60 minutes, and glossiness and surface resistivity after the 30-minute and 60-minute tests were measured for comparison.

Stain resistance: On the surface of the coating are drawn lines with a load of 1 kg by means of pencils of 6B to 9H, respectively, and the traces of the drawn lines are

TABLE 4

(Display panel with a transparent conductive coating)

| | | Conductive Coating | | | Protective Coating | | | | |
|---|---|---|---|---|---|---|---|---|---|
| | Coating Solution No. | Pre-heating Temp. | Coating Method | (Dry) Heat Condition | Coating Solution | Pre-heating Temp. | Coating Method | Heating Condition | Cure Promoting Treatment |
| Ex. 9 | 1 | 60° C. | Spray | 180° C./30 min. | — | — | — | — | — |
| Ex. 10 | 2 | 60° C. | Spray | (90° C./1 min.) | Matrix A | 60° C. | Spray | 180° C./30 min. | — |
| Ex. 11 | 3 | Room temp. | Spinner | (90° C./1 min.) | Matrix A | Room temp | Spinner | 250° C./30 min. | — |
| Ex. 12 | 4 | 40° C. | Spinner | (90° C./1 min.) 180° C./30 min. | — | — | — | — | — |
| Ex. 13 | 5 | 40° C. | Spinner | (90° C./1 min.) | Matrix A | 60° C. | Spray | 150° C./30 min. | UV treatment after drying and protective film coating |
| Ex. 14 | 6 | 40° C. | Spray | (90° C./1 min.) 180° C./30 min. | — | — | — | — | — |
| Ex. 15 | 7 | Room temp. | Spinner | (90° C./1 min.) 160° C./30 min. | — | — | — | — | After dying $NH_3$ vapor treatment |
| Ex. 16 | 8 | 60° C. | Spray | 180° C./30 min. | — | — | — | — | — |
| Comp. Ex. 4 | 9 | 60° C. | Spray | 180° C./30 min. | — | — | — | — | — |
| Comp. Ex. 5 | 10 | 40° C. | Spinner | 180° C./30 min. | — | — | — | — | — |
| Comp. Ex. 6 | 11 | Room temp. | Spinner | (90° C./1 min.) 180° C./30 min. | — | — | — | — | — |

Evaluation of Display Panel with a Transparent Conductive Coating

The display panels were provided with transparent conductive coatings of Examples 9–16 and Comparative Examples 4–6 respectively and following evaluations were made on the display pannels.

The results obtained are shown in Table 5.

wiped out slightly by means of a gauze impregnated with ethanol. After the 10-time wiping, the hardness of the pencil that the trace remained is taken as an indication of evaluation (with respect to stain resistance, reference was made in the specification. (Page 18 line 24–Page 19 line 2)

Resolving power: Evaluated by the method mentioned previously.

As is clear from Table 5, the transparent conductive coatings formed from the coating solutions of the invention are practically free from changes of glossiness and surface resistivity in the film strength test and the test of resistance to boiling water. The display panel with a coating formed from the coating solution of Comparative Example 3 comprising the matrix having a small average degree of polymerization has a surface resistivity as high as $5 \times 10^{11}$ $\Omega/\square$. This high surface resistivity is considered ascribable to the fact that an insulating layer is formed at the surroundings of at least parts of the conductive particles by a coupling phenomenon of the conductive particle surface due to a low molecular weigh component present in the matrix. On the other hand, no such a phenomenon as mentioned above is observed in the coating solutions of the invention, hence the coatings obtained therefrom have a stable surface resistivity.

[Examples 17–24, Comparative Examples 7–9]

TABLE 5

| | Gloss-iness G (%) | Haze H (%) | Surface Resistivity Rs ($\Omega/\square$) | Film Strength $\Delta$G | | Resistance to Boiling Water | | | | Stain Resistance | Resolution Power (bar/cm) |
|---|---|---|---|---|---|---|---|---|---|---|---|
| | | | | | | 30 min | | 60 min | | | |
| | | | | $\Delta$G | Rm/Rs | $\Delta$G | Rm/Rs | $\Delta$G | Rm/Rs | | |
| Ex. 9 | 58 | 7.9 | $5 \times 10^9$ | 7.8 | 1.5 | −0.9 | 0.9 | −1.5 | 1.2 | 2H | 65 |
| Ex. 10 | 50 | 6.3 | $5 \times 10^8$ | 3.1 | 0.9 | −1.0 | 1.0 | −2.0 | 1.1 | 9H | 75 |
| Ex. 11 | 89 | 0.0 | $1 \times 10^6$ | 0.0 | 1.1 | 0.0 | 1.0 | 0.0 | 1.0 | 9H | 85 |
| Ex. 12 | 96 | 0.2 | $7 \times 10^7$ | 4.7 | 2.1 | −1.1 | 0.8 | −2.5 | 0.6 | 7H | 80 |
| Ex. 13 | 78 | 0.0 | $1 \times 10^8$ | 1.2 | 1.1 | 0.0 | 1.1 | −0.3 | 1.1 | 9H | 80 |
| Ex. 14 | 92 | 0.8 | $8 \times 10^8$ | 3.3 | 2.8 | −1.8 | 1.5 | −4.0 | 2.5 | 2H | 80 |
| Ex. 15 | 96 | 0.5 | $2 \times 10^7$ | 1.8 | 0.9 | −0.1 | 1.0 | −1.3 | 1.0 | 4H | 80 |
| Ex. 16 | 59 | 8.0 | $2 \times 10^9$ | 8.0 | 1.3 | −2.0 | 0.9 | −4.0 | 0.8 | 2H | 65 |
| Comp. Ex. 4 | 54 | 10.5 | $3 \times 10^9$ | 13.4 | 3.0 | −6.6 | 2.3 | −45 | 1000 | B | 50 |
| Comp. Ex. 5 | 89 | 1.8 | $2 \times 10^8$ | 35.2 | 25.8 | −20.6 | 5.0 | Peeling | | 2H | 80 |
| Comp. Ex. 6 | 92 | 0.3 | $5 \times 10^{11}$ | 4.9 | 1.5 | −1.5 | 3.0 | 4.0 | 4.1 | 3H | 85 |

Preparation of Display Device and Evaluation Thereof

Using Braun tubes having the display panels with each of the transparent conductive coatings of Examples 9–16 and Comparative Examples 4–6 respectively, each of the display devices (terminal display) of Examples 17–24 and Comparative Examples 7–9 was assembled.

Examples and comparative examples of the display devices correspond to those of the display panels with a transparent conductive coating, for example, the display device of Example 17 has the display panel with a transparent conductive coating of Example 9.

The display devices of Examples 17–24 were able to form clear and sharp images even after a long term storage or use without contamination of the displayed picture with dust or the like. On the other hand, in the display device of Comparative Examples 7, it was found that the displayed images are somewhat low in definition and liable to be stained with dust or the like. In the display device of Comparative Example 8, there was brought about such a defect that the transparent conductive coating formed on the surface of display panel peels therefrom. In the display device of Comparative Example 9, antistatic effect on the displayed picture was not sufficient, and there was observed such a tendency that dust or the like attaches to the displayed picture after a long term storage.

[Example 25]

Refractive index adjusting particles were added to the coating solution for forming a conductive coating and coating solutions for forming a protective coating, respectively, to prepared the coating solutions as shown in Table 6. Of the refractive index adjusting particles used, titania sol ($TiO_2$ concentration 20 wt %) having dispersed therein particles having an average particle diameter of 200 Å was used as $TiO_2$ particles, and magnesium fluoride sol ($MgF_2$ concentration 5 wt %) having dispersed therein particles having an average particle diameter of 300 Å was used as $MgF_2$ particles.

After applying by the spinner method (100 rpm, 1 minute) the coating solution for forming a conductive coating shown in Table 6 to the surface of Braun tube display panel (14") preheated to 40° C., the coating was heated at 180° C. for 30 minutes to form a conductive coating (coating thickness 800 Å)

Subsequently, after preheating the above-mentioned display panel with the conductive coating to 40° C., the coating solution for forming a protective coating as shown in Table 6 was applied under the same condition as above to the surface of said display panel to form thereon a protective coating (1000 Å).

TABLE 6

| Coating solution | Conductive particle dispersion (g) | Matrix (g) | Diluent (g) | | pH | Refractive adjusting particles (g) | Solid concentration (Wt %) |
|---|---|---|---|---|---|---|---|
| Coating Solution for Forming Conductive Coating | II 30 | D 60 | Ethanol DAA | 975 120 | 3.6 | $TiO_2$ 3 | 1.0 |
| Coating Solution for Forming Protective Coating | — | D 60 | Ethanol DAA | 195 15 | — | $MgF_2$ 1.5 | 1.5 |

The display panel with an anti-reflection coating of Example 25 thus obtained was evaluated in the same manner as in Example 9, and a surface reflectance thereof was measured.

The results obtained are shown in Table 7.

TABLE 7

| Glossiness G (%) | Haze H (%) | Reflectance (%) | Surface resistivity Rs (Ω/□) | Film strength | | Resistance to boiling water | | | | Stain resistance | Resolving power (bar/cm) |
|---|---|---|---|---|---|---|---|---|---|---|---|
| | | | | | | 30 Min. | | 60 Min. | | | |
| | | | | ΔG | Rm/Rs | ΔG | Rm/Rs | ΔG | Rm/Rs | | |
| 45 | 0.0 | 0.5 | $2 \times 10^8$ | 9.5 | 2.0 | −4.0 | 1.5 | −5.0 | 2.0 | 5H | 85 |

[Example 26]

On the surface of a glass substrate (450×300 mm) for use as a platen glass of duplicator was formed a coating under the conditions as shown in Table 8. This glass substrate with the coating was evaluated in the same manner in Example 9.

The results obtained are shown in Table 9.

As the result, no paper clogging took place before more than 100,000 sheets of copy paper were copied in the duplicator using a platen glass with the coating of the present invention, though paper clogging took place before 2000 sheets of copy paper were copied in the duplicator using a platen glass having no coatings thereon.

TABLE 8

| Conductive Coating | | | | Protective Coating | | | | Cure promotion treatment |
|---|---|---|---|---|---|---|---|---|
| Coating solution No. | Preheating temp. | Coating method | (drying) Heating conditions | Coating solution | Preheating temp. | Coating method | Heating conditions | |
| 3 | Room temp. | Roll coater | (90° C./ 1 min) | Matrix A | Room temp. | Roll coater | 250° C./ 30 min | — |

TABLE 9

| Total light transmittance (%) | Glossiness G (%) | Haze H (%) | Surface resistivity Rs (Ω/□) | Film strength | | Resistance to boiling water | | | | Stain resistance |
|---|---|---|---|---|---|---|---|---|---|---|
| | | | | | | 30 Min. | | 60 Min. | | |
| | | | | ΔG | Rm/Rs | ΔG | Rm/Rs | ΔG | Rm/Rs | |
| 92.5 | 135 | 0.0 | $2 \times 10^5$ | 0.3 | 1.0 | −0.0 | 1.0 | −2.0 | 1.0 | 9H |

Further, this glass substrate was incorporated into a duplicator equipped with ADF, and copy paper was fed to the duplicator to investigate the number of sheets of copy paper until the paper clogging takes place.

What is claimed is:

1. A conductive substrate having on the surface thereof a transparent conductive coating formed from a coating solution for forming a transparent conductive coating comprising conductive particles having:

(a) an average particle diameter of not more than 500 Å, and (b) an amount of said particles having a particle diameter of not more than 600 Å being not less than 60% by weight, (c) an amount of said particles having a particle diameter of not more than 100 Å being not less than 5% by weight, (d) an amount of said particles having a particle diameter of not less than 1000 Å being not more that 15% by weight, and a matrix consisting of a silica polymer having (A) an average degree of polymerization of 1,500–10,000, and (B) an amount of said polymer having a degree of polymerization of not more than 3,000 being not more than 50% by weight, and (C) an amount of said polymer having a degree of polymerization of not less than 10,000 being not more than 20% by weight.

2. The conductive substrate as claimed in claim 1 wherein a transparent protective coating is formed on the surface of the transparent conductive coating.

3. The conductive substrate as claimed in claim 1 or 2 wherein the surface of the substrate, on which the transparent conductive coating has been formed, has a surface resistivity of $10^3$ to $10^{10}$ $\Omega/\square$, and a haze of not more than 1%.

4. The conductive substrate as claimed in claim 1 or 2 wherein the surface of the substrate, on which the transparent conductive coating has been formed, has a surface resistivity of $10^3$ to $10^{10}$ $\Omega/\square$, and a glossiness of 40 to 90%.

5. The conductive substrate claimed in claim 2 wherein the surface of the substrate, on which the transparent conductive coating and transparent protective coating have been formed, has a surface resistivity of $10^3$ to $10^{10}$ $\Omega/\square$, a glossiness of 40 to 90%, and a surface reflectance of not more than 1%.

6. The conductive substrate as claimed in claim 1 wherein the surface of the substrate, on which the transparent conductive coating has been formed, has a surface resistivity of $10^3$ to $10^{10}$ $\Omega/\square$, and a haze of not more than 1%.

7. The conductive substrate as claimed in claim 1 wherein the surface of the substrate, on which the transparent conductive coating has been formed, has a surface resistivity of $10^3$ to $10^{10}$ $\Omega/\square$, and a glossiness of 40 to 90%.

8. A conductive substrate wherein the conductive substrate is a face-plate of a display panel for a display device, said conductive substrate having on the surface thereof a transparent conductive coating formed from a coating solution for forming a transparent conductive coating comprising conductive particles having:

(a) an average particle diameter of not more than 500 Å, (b) an amount of said particles having a particle diameter of not more than 600 Å being not less than 60% by weight, (c) an amount of said particles having a particle diameter of not more than 100 Å being not less than 5% by weight, (d) an amount of said particles having a particle diameter of not less than 1000 Å being more than 15% by weight, and a matrix consisting of a silica polymer having:

(A) an average degree of polymerization of 1,500–10,000, (B) an amount of said polymer having a degree of polymerization of not more than 3,000 being not more than 50% by weight, and (C) an amount of said polymer having a degree of polymerization of not less than 10,000 being not more than 20% by weight.

9. The conductive substrate as claimed in claim 8 wherein a transparent protective coating is formed on the surface of the transparent conductive coating.

10. The conductive substrate as claimed in claim 8 or 9 wherein the display panel, on which the transparent conductive coating has been formed, has a surface resistivity of $10^3$ to $10^{10}$ $\Omega/\square$, a haze of not more than 1% and a resolving power of more than 70 bar/cm.

11. The conductive substrate as claimed in claim 8 or 9 wherein the display panel, on which the transparent conductive count has been formed, has a surface resistance of $10^3$ to $10^{10}$ $\Omega/\square$, a glossiness of 40 to 90%, and a resolving power of more than 60 bar/cm.

12. The conductive substrate as claimed in claim 9 wherein the display panel, on which the transparent conductive coating and the transparent protective coating have been formed, has a surface resistivity of $10^3$ to $10^{10}$ $\Omega/\square$, a glossiness of 40 to 90%, a surface reflectance of not more than 1%, and a resolving power of more than 60 bar/cm.

13. The conductive substrate as claimed in claim 8 wherein the display panel, on which the transparent conductive coating has been formed, has a surface resistivity of $10^3$ to $10^{10}$ $\Omega/\square$, a haze of not more than 1% and a resolving power of more that 70 bar/cm.

14. The conductive substrate as claimed in claim 8 wherein the display panel, on which the transparent conductive coating has been formed, has a surface resistance of $10^3$ to $10^{10}$ $\Omega/\square$, a glossiness of 40 to 90%, and a resolving power of more than 60 bar/cm.

\* \* \* \* \*

UNITED STATES PATENT AND TRADEMARK OFFICE
CERTIFICATE OF CORRECTION

PATENT NO. : 5,492,762
DATED : February 20, 1996
INVENTOR(S) : Toshiharu Hirai, Michio Komatsu, Akira Nakashima, Yoneji Abe and Yukihiro Iwasaki It is certified that error appears in the above-indentified patent and that said Letters Patent is hereby corrected as shown below:

Column 1 Line 5 after "This is a" insert --division of--.

Column 6 Line 30 "plaze" should read --plate--.

Column 6 Line 58 "1%  ," should read --1%,--.

Column 10 Line 22 "conducive" should read --conductive--.

Column 11 Line 4 "durabiling" should read --durability--.

Table 4, Column 15, 'Ex. 11, *Protective Coating, Preheating Temp.*', "Room temp" should read --Room temp.--.

Column 17 Line 16 "weigh" should read --weight--.

Column 18 Line 59 after "Å)" insert --.--.

Claim 1(d) Line 10 Column 21 "that 15%" should read --than 15%--.

Claim 11 Line 31 Column 22 "count" should read --coating--.

Claim 13 Line 44 Column 22 "that 70" should read --than 70--.

Signed and Sealed this

Sixteenth Day of July, 1996

Attest:

BRUCE LEHMAN

Attesting Officer

Commissioner of Patents and Trademarks